United States Patent [19]
Furutani et al.

[11] Patent Number: 5,375,088
[45] Date of Patent: * Dec. 20, 1994

[54] RANDOM ACCESS MEMORY WITH PLURALITY OF AMPLIFIER GROUPS

[75] Inventors: Kiyohiro Furutani; Koichiro Mashiko; Kazutami Arimoto; Noriaki Matsumoto; Yoshio Matsuda, all of Itami, Japan

[73] Assignee: Mitsubishi Denki Kabushiki Kaisha, Tokyo, Japan

[ * ] Notice: The portion of the term of this patent subsequent to Oct. 10, 2006 has been disclaimed.

[21] Appl. No.: 149,540

[22] Filed: Nov. 9, 1993

Related U.S. Application Data

[60] Continuation of Ser. No. 912,135, Jul. 9, 1992, Pat. No. 5,293,598, which is a continuation of Ser. No. 634,813, Dec. 31, 1990, abandoned, which is a continuation of Ser. No. 396,042, Aug. 21, 1989, abandoned, which is a division of Ser. No. 77,306, Jul. 24, 1989, Pat. No. 4,873,669.

[30] Foreign Application Priority Data

Jul. 30, 1986 [JP] Japan ................ 61-179741

[51] Int. Cl.[5] ................................. G11C 7/00
[52] U.S. Cl. ............... 365/189.01; 365/189.07; 365/201; 365/230.03
[58] Field of Search ............. 365/189.01, 201, 230.03, 365/189.04, 189.07; 371/21

[56] References Cited

U.S. PATENT DOCUMENTS

| | | | |
|---|---|---|---|
| 4,464,750 | 8/1984 | Tatematsu | 365/201 X |
| 4,672,582 | 6/1987 | Nishimura et al. | 365/201 X |
| 4,742,486 | 5/1988 | Takemae et al. | 365/207 X |
| 4,744,061 | 5/1988 | Takemae et al. | 365/201 |
| 4,873,669 | 10/1989 | Furutani et al. | 365/189.01 |
| 5,293,598 | 3/1994 | Furutani et al. | 395/400 |

*Primary Examiner*—Eugene R. LaRoche
*Assistant Examiner*—D. Hyun Yoo
*Attorney, Agent, or Firm*—Sterne, Kessler, Goldstein & Fox

[57] ABSTRACT

A semiconductor memory device operable for reading and writing in a normal mode and in a test mode is divided into memory cell sections each having blocks of memory cells. Data bus lines are connected to the respective blocks, and switches interconnect data bus lines connected to blocks of the different sections. The switch are made conductive during reading and writing in the normal mode and during writing in the test mode, and nonconductive during reading in the test mode. Input data are applied onto the data bus lines connected to one of the blocks for writing in the blocks of the sections simultaneously during writing in the normal mode and in the test mode. In the normal mode, data are read out of the blocks of the sections through the data bus lines connected to the above-mentioned one of the blocks. In the test mode, the data are read out of the blocks of the sections through the data bus lines connected to the respective blocks.

5 Claims, 4 Drawing Sheets

RANDOM ACCESS MEMORY WITH PLURALITY OF AMPLIFIER GROUPS

This application is a continuation of application Ser. No. 07/912,135, filed Jul. 9, 1992, now U.S. Pat. No. 5,293,598, which is a continuation of application Ser. No. 07/634,813 filed Dec. 31, 1990, abandoned, which is a continuation of application Ser. No. 07/396,042 filed Aug. 21, 1989, abandoned, which is a divisional of application Ser. No. 07/077,306 filed Jul. 24, 1989, which is now U.S. Pat. No. 4,873,699.

BACKGROUND OF THE INVENTION

The present invention relates to a MOS random access memory (RAM), and particularly to an improvement in the configuration of data bus lines of a large capacity MOSRAM.

FIG. 1 shows a configuration of data bus lines of a conventional MOS dynamic RAM. In recent years, the capacity of MOS dynamic RAMs is increasing. With that, the time required for testing a RAM is increasing and being more problematical. Various schemes have been proposed to reduce the test time. For instance, in the ISSCC Digest Technical Papers (1985); p. 240; M. Kumanoya et al., it is proposed to treat a 1−M bit DRAM of a ×1 configuration as a memory of ×4 configuration during test mode. With the ×4 configuration for the test mode the memory cell array is divided into four blocks, and part (two bits) of the address code are used to select one of the four blocks while the rest of the address code is used to select one of the memory cells in each block. When for instance reading data by application of an address code, four bits of data are read out of the corresponding memory cells (addressed by the above-mentioned "rest of the address code") of the four blocks onto four pairs of I/O lines and only one of switches connected to the I/O lines is made conductive by the above-mentioned "part of the address code", so that only one of the four bits is output from the memory cell array.

FIG. 1 shows a MOS DRAM of a ×1 configuration having a test mode function of a ×4 configuration. In the figure, the MOS DRAM comprises a memory cell array 1, four preamplifiers 2 for detecting and amplifying data on four pairs of complementary data I/O lines 7 read out of the memory cell array 1, a mode controller 3 for switching between a normal mode and a test mode, a test controller 4 for providing signals for the test mode operation, a block selector 5 for secting one of the four outputs (data) read out during the normal mode and a buffer 6 in the form of an exclusive NOR gate receiving the four outputs (data) during the test mode and outputting test data.

During the normal mode operation, the mode controller 3 is kept in the normal mode under control of the test controller 4. In this state, data are read out of the memory cell array 1 onto the four pairs of complementary I/O lines 7, and are detected and amplified by the preamplifiers 2. The four data are then read out by the block selector 5 and one of the four data corresponding to the address then being supplied is output. If the memory cell array 1 consists of N memory cells or N bits, the time required for reading all the bits is $$(\text{cycle time } t_c) \times N = N \cdot t_c$$

During the test mode operation, the four data are similarly supplied via the I/O lines 7 to and amplified at the preamplifiers 2. The test controller 4 then provides a test control signal, upon which the mode controller 3 operates in the test mode. The four data are then supplied to the exclusive-NOR buffer 6, and the test result is output. The time required for reading all the bits is $$N \cdot t_c / 4$$

Writing data is achieved by inputing data via the Din terminal, the block selector 5, the mode controller 3 and the pairs of the I/O lines 7. In the normal mode, the data is supplied to the memory cell array 1 through one of the pairs of the I/O lines 7. In the test mode, the same data are supplied to the memory cell array 1 through the four pairs of the I/O lines 7 to the four bits (four memory cells). Thus, the time required for writing in the test mode is ¼ of the time required for writing in the normal mode.

The concept of using the ×4 configuration in the test mode can be hypothetically extended to a ×8 configuration, a ×16 configuration, etc. to cope with further increase in the capacity of memories. But this leads to increase in the number of the I/O lines disposed in parallel with each other on the chip surface, e.g., 8 pairs, 16 pairs, etc., and increased complexity of the bus line configuration and increased chip surface area.

SUMMARY OF THE INVENTION

An object of the invention is to improve test mode functions, without increasing the number of I/O lines disposed in parallel with each other.

Another object of the invention is to reduce the test time without increasing the complexity of the bus line configuration.

According to the invention, there is provided a memory device operable for reading and writing in a normal mode and in a test mode, comprising, memory cell sections each having blocks of memory cells, data bus lines connected to the respective blocks, switch means for interconnecting data bus lines connected to blocks of the different sections, switch control means for causing the switch means to be conductive during reading and writing in the normal mode and during writing in the test mode, and causing the switch means to be nonconductive during reading in the test mode, means connected to the data bus lines that are connected to the blocks of one of the sections for applying input data onto the data bus lines for writing in the blocks of the sections simultaneously during writing in the normal mode and in the test mode, and for outputting the data read out of the blocks of the sections during reading in the normal mode, and for outputting the data read out of the blocks of said one of the sections during reading in the test mode, and means connected to the data bus lines that are connected to the blocks of the section or sections other than said one of the sections, for outputting the data read output of the memory cell blocks of said other section or sections during reading in the test mode.

DETAILED DESCRIPTION OF THE PREFERRED EMBODIMENTS

Figure 1:
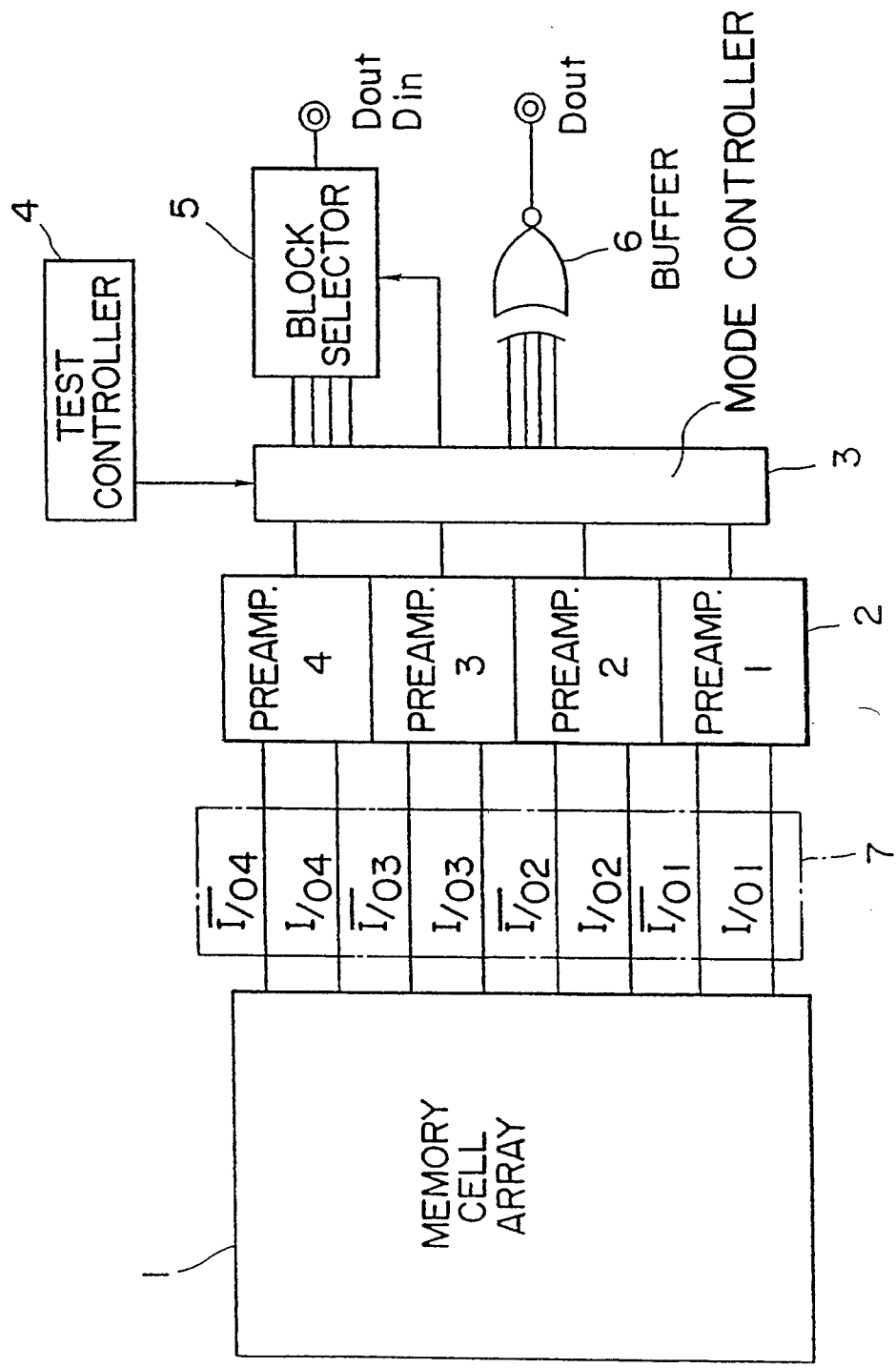
FIG. 1 is a block diagram showing a prior art random access memory.

An embodiment of the invention will be described with reference to FIG. 2. In FIG. 2, the members or elements bearing the reference numerals identical to those in FIG. 1 have identical or similar functions. The memory cell array is divided into two sections 8 and 9. Connected to the first section 8 are four pairs of complementary I/O lines 14. connected to second section 9 are four pairs of complementary I/O lines 15. The I/O lines 14 and 15 are interconnected by I/O switches 13. The layout of the I/O lines 14 and 15 on the chip surface of the semiconductor device is such that the I/O lines interconnected by the I/O switches 13 are disposed along common straight lines. In this connection, it should be noted that FIG. 2 shows not only the interconnection of the I/O lines but also the layout of the I/O lines on the chip surface.

Four preamplifiers 10 are connected to the four pairs of the I/O lines 15 and are used for reading in the normal mode as well as in the test mode. Four test preamplifiers 11 are connected to the four pairs of the I/O lines 14 and are used for reading in the test mode, but not in the normal mode. A write controller 12 provides a signal 12a which is set at "0" for writing and "1" for reading. The signal 12a is input to a NAND gate 17, which also receives a signal 4a from a test controller 4. The signal 4a is at "1" during test mode and "0" during normal mode. The output 17a of the NAND gate 17 is at "0" during reading in the test mode, and is at "1" during writing in the test mode and during reading and writing in the normal mode. Accordingly, the I/O switches 13 are conductive except during reading in the test mode. An exclusive-NOR buffer 16 is connected to receive 8 bits of data, i.e., four bits from the test preamplifiers 11, and the other four bits from the preamplifiers 10 via the mode controller 3, and produces an output of "1" when all the inputs are identical, i.e., all "1" or all "0".

Row decoders 18 and 19 cooperate to select rows in the sections 8 and 9 during reading and writing in the normal mode. For instance, in the normal mode, the MSB of the row address code is used to select one of the sections 8 and 9. Memory cells one each of the four blocks of the selected section are selected by the rest of the address code, and one of the four memory cells is selected by the block selector 5 by selection of one of the I/O lines. In the test mode, the MSB of the row address code is not used for the selection of one of the sections 8 and 9. (It can therefore be used for other purposes.) Accordingly, memory cells one each of the four blocks of each of the sections are selected by the above-mentioned "rest of the address code", and the data are simultaneously read out of or written in eight memory cells.

Figure 2:
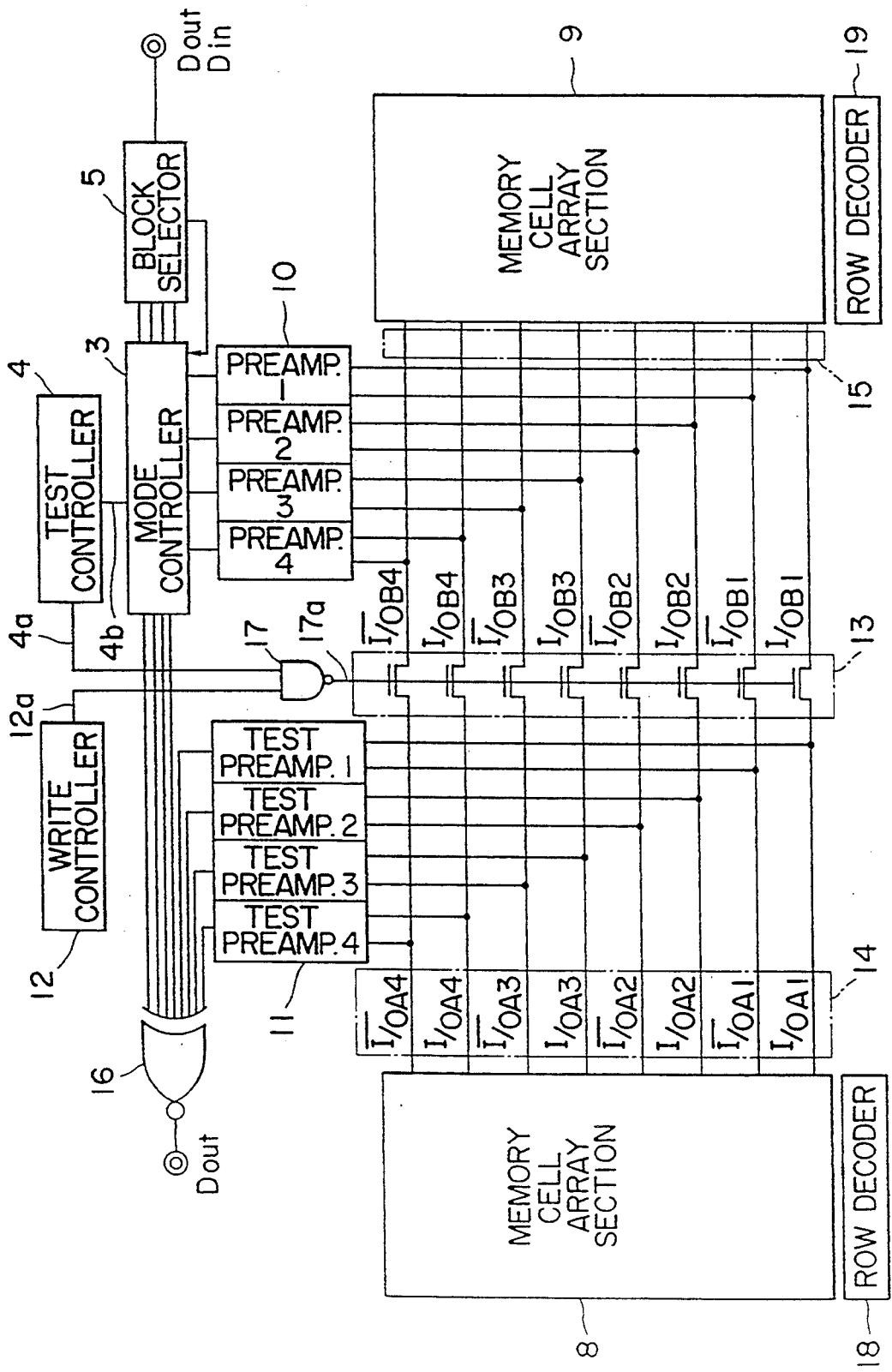
FIG. 2 is a block diagram showing a random access memory of an embodiment of the invention.

The embodiment shown in FIG. 2 has the configuration of four pairs of I/O lines and the mode controller 3 which are identical to those of the ×4 configuration shown in FIG. 1, but can read and write 8 bits of data simultaneously in the test mode.

The operation will now be described.

During reading in the normal mode, the I/O switches 13 are on. When the first section 8 is accessed, four bits of data are read out onto the four pairs of I/O lines 14. The control signals 17a to the I/O switches 13 are at "1", under control by the write controller 12 and the test controller 4, so that the I/O switches 13 are conductive and the I/O lines 14 and 15 are respectively interconnected. As a result, the data on the I/O lines 14 are transmitted to the I/O lines 15. The preamplifiers 10 amplifies the data and the mode controller 3 and the block selector 5 select one of the four bits of data, which is output via the terminal Dout.

During writing in the normal mode, when one bit of data is to be written in the first section 8, the data is input via the terminal Din, the block selector 5 and the mode controller 3, by which the data is transmitted to only one of the pairs of the I/O lines 15, and is transmitted further to one of the pairs of the I/O lines 14 through the I/O switches 13 now being closed. Thus, the data is written in the first section 8.

For writing data in the second section 9, the data input via the terminal Din is transmitted to one of the pairs of the I/O lines 15 and is written in the second section 9.

The operations during reading in the test mode are as follows: The I/O switches 13 are then open under control of the test controller 4 and the write controller 12.

Data are read out of the first section 8 and onto the four pairs of I/O lines 14, and are amplified by the four test preamplifiers 11, whose outputs are input to an exclusive-NOR buffer 16. Simultaneously with the reading of data from the first section 8, data are also read out of the second section 9 onto the four pairs of I/O lines 15, and are amplified by the four preamplifiers 10, whose outputs are input to the exclusive-NOR buffer 16. The exclusive-NOR buffer 16 produces an output "1" when all the eight inputs are identical, i.e., all "1" or all "0". In advance of the data reading in the test mode, the same data are written into the eight memory cells, designated by the same address code except the MSB, from which the data are read out simultaneously during the subsequent reading. If all the data as input to the exclusive-NOR buffer 16 are identical and its output is "1", it is judged that the memory operation is correct.

During writing in the test mode, the I/O switches 13 are conductive under control of the test controller 4 and the write controller 12. The data input via the terminal Din are transmitted to the four pairs of I/O lines 15 and are written into the section 9. The data are also transferred to the I/O lines 14 and are written into the first section 8. Thus, the data are simultaneously written into eight memory cells or eight bits.

In other words, the memory device operates as a memory device of ×8 configuration, and the test time is reduced to ½.

Figure 3:
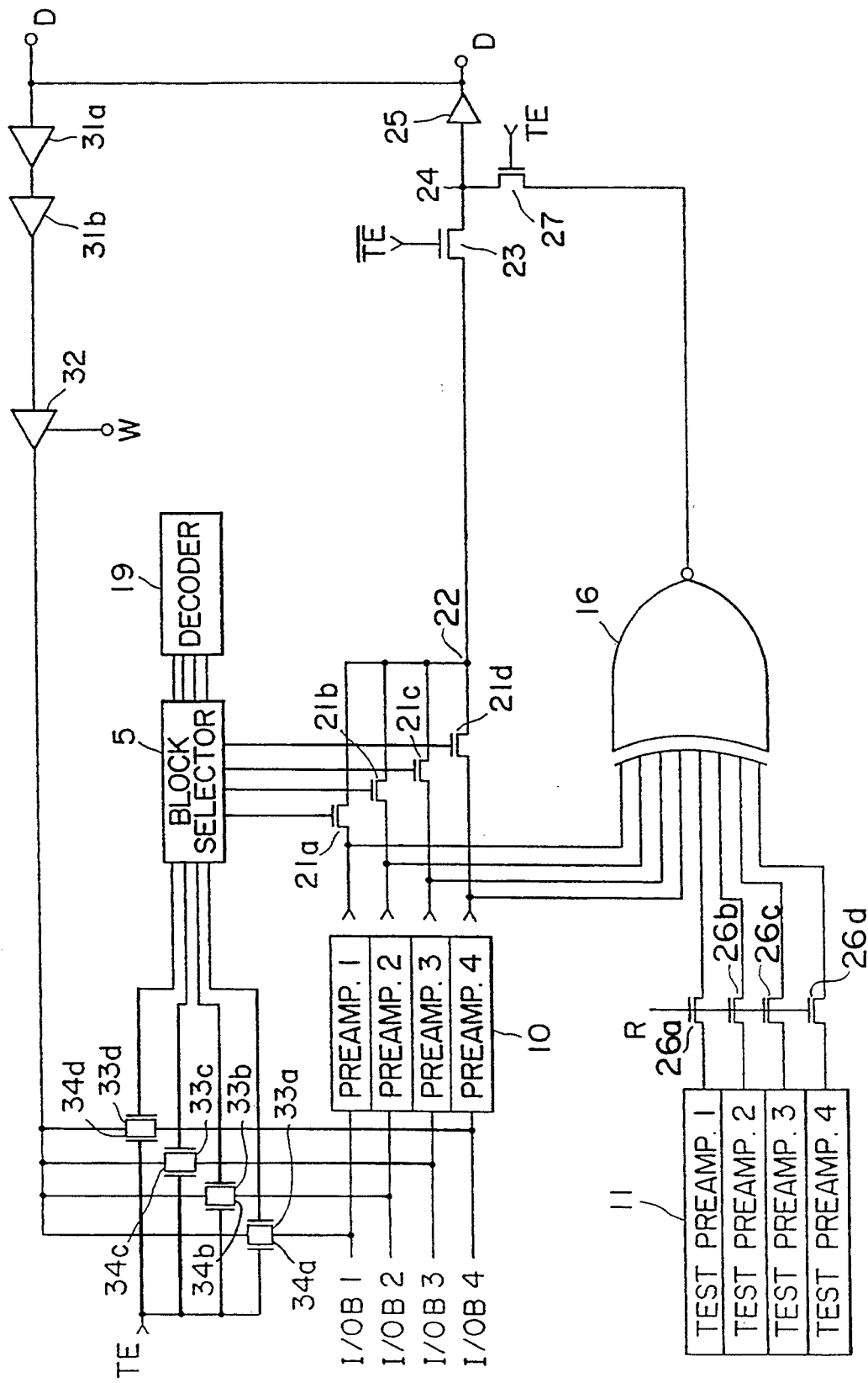
FIG. 3 is a block diagram showing a specific example of the mode controller.

FIG. 3 shows a specific example of the mode controller 3 with various circuit components connected thereto. The outputs of the preamplifiers 10 are connected to a node 22 through switches in the form of MOS transistors 21a to 21d, which are selectively made conductive by the block selector 5, which in turn is controlled by a decoder 19. The node 22 is connected to a node 24 through a switch in the form of MOS transistor 23, which is made conductive when a test control signal $\overline{TE}$ is at "1", i.e., in the normal mode. The node 24 is connected through an amplifier 25 to a terminal D.

During reading in the normal mode one of the MOS transistors 21a to 21d and the MOS transistor 23 are conductive, so that one of the outputs of the preamplifiers 10 is transmitted to and output through the terminal D.

The outputs of the preamplifiers 10 are also input to the exclusive-NOR buffer 16. The outputs of the test preamplifiers 11 are also input to the exclusive-NOR buffer 16 through switches in the form of MOS transistors 26a to 26d which are made conductive when a read signal R from the write controller 12 is at "1" indicating that the reading (rather than writing) is to be performed.

During reading in the test mode, the outputs of the preamplifiers 10 and the test preamplifiers 11 are input to the exclusive-NOR buffer 16. When all the inputs to the exclusive-NOR buffer 16 are identical, i.e., all "1" or all "0", the output of the exclusive-NOR buffer 16 is at "1". This output is passed through a switch in the form of MOS transistor 27, which is conductive during the test mode by virtue of a test control signal TE from the test controller 4 which is at "1" in the test mode, and through the amplifier 25 to the terminal D.

Input buffers 31a, 31b and 32, and MOS transistors 33a to 33d, 34a to 34d are provided for writing. The buffer 32 is activated only during writing by a write control signal W from the write controller 12.

In the normal mode, one of the four MOS transistors 33a to 33d is selected and made conductive. The data input through the terminal D is therefore passed through the MOS transistor being conductive to the I/O line connected to the conducting MOS transistor.

In the test mode, all the four transistors 34a to 34d are conductive by virtue of the test control signal TE. The input data is therefore transmitted to all the four I/O lines I/O B1 to I/O B4.

Although not illustrated, complementary signals are also supplied to complementary I/O lines $\overline{I/O}$ B1 to $\overline{I/O}$ B4.

Figure 4:
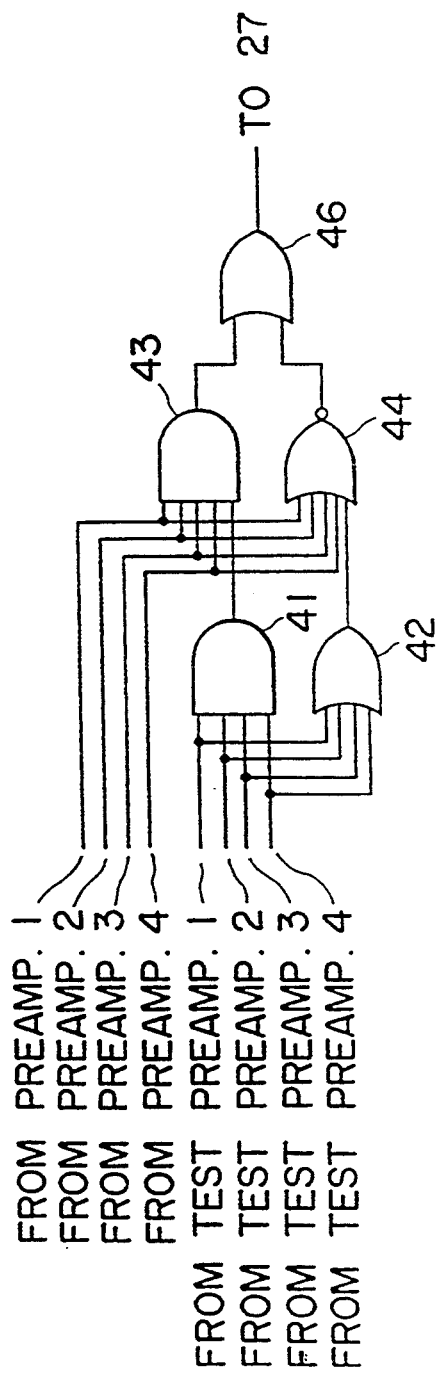
FIG. 4 is a block diagram showing an example of exclusive-NOR gate.

FIG. 4 shows an example of configuration of the exclusive-NOR buffer. As illustrated, it comprises and AND gate 41 and an OR gate 42 receiving four bits from the test preamplifiers 11, and AND gate 43 and a NOR gate 44 receiving four bits from the preamplifiers 10 as well as the outputs of the AND gate 41 and the OR gate 42, respectively. The output of the AND gate 43 is at "1" when all the outputs of the preamplifiers 10 and the test preamplifiers 11 are at "1". The output of the NOR gate 44 is at "1" when all the outputs of the preamplifiers 10 and the test preamplifiers 11 are at "0". The outputs of the AND gate 43 and the NOR gate 44 are input to an OR gate 46 whose output is at "1" when the inputs to the exclusive-NOR buffer are all "1" or all "0", i.e., identical to each other.

The embodiment described above is of the ×1 configuration, has four pairs of I/O line and operates as ×8 configuration in the test mode. But the invention is not limited to the specific configuration with respect to the number of blocks, the number of I/O lines and the number of sections.

As has been described according to the invention, the test time can be reduced without increasing the number of I/O line disposed in parallel with each other and without increasing the configuration of I/O lines.

What is claimed is:

1. A semiconductor memory device for reading and writing in normal and test modes, respectively, comprising:

a plurality of memory cell sections, each of said plurality of memory cell sections having a plurality of blocks, with each of said plurality of blocks having a plurality of memory cells;

a plurality of data bus line groups, each of said plurality of data bus line groups, having a plurality of data bus lines, each of said data bus lines coupled to a respective block of said plurality of memory cell sections in such a manner that each of said plurality of data bus lines reads data from one of said plurality of memory cells of said respective block of said plurality of memory cell sections, wherein each of said plurality of memory cells is selected by address information;

a plurality of amplifier groups, each of said plurality of amplifier groups including a plurality of amplifier means having active and inactive states, one amplifier means in each of said plurality of amplifier groups being coupled to a corresponding one of said plurality of data bus lines, wherein, in the normal mode, said plurality of amplifier means of one of said plurality of amplifier groups are in their active state and the plurality of amplifier means of all of said plurality of amplifier groups not including said one of said plurality of amplifier groups are in their inactive state, and in the test mode, said plurality of amplifier means of all of said plurality of amplifier groups are in their active state, each of said plurality of amplifier means of each of said plurality of amplifier groups amplifying data appearing on said corresponding one of said plurality of data bus lines to which said each of said plurality of amplifier means is coupled; and means for comparing outputs of all of said plurality of amplifier means and for generating a digital output only when all of said plurality of amplifier means outputs are the same.

2. A semiconductor memory device according to claim 1, further comprising an address decoder for selecting one of said plurality of memory cell blocks in the normal mode.

3. A semiconductor memory device according to claim 1, further comprising decoder means for selecting one of said memory cell sections in said normal mode.

4. A semiconductor memory device according to claim 1, further comprising switch means interposed between said plurality of data bus line groups, said switch means having first and second states, wherein, in the normal mode, said switch means is in said first state to thereby electrically couple said plurality of data bus line groups to each other, and in a read state of the test mode, said switch means is in said second state to thereby electrically uncouple said plurality of data bus line groups from each other.

5. A semiconductor memory device for reading and writing in normal and test modes, respectively, comprising:

first and second memory cell sections, each of said first and second memory cell sections having a plurality of blocks, with each of said plurality of blocks having a plurality of memory cells;

first and second data bus line groups, each of said first and second data bus groups having a plurality of data bus lines, each of said plurality of data bus lines coupled to a respective block of said first and second memory cell sections in such a manner that each of said plurality of data bus lines reads data from one of said plurality of memory cells of said respective block of said first and second memory cell sections, wherein each of said plurality of memory cells is selected by address information;

first and second amplifier groups, each of said first and second amplifier groups including a plurality of amplifier means having active and inactive states, one amplifier means in each of said first and second amplifier groups being coupled to a corresponding one of said plurality of data bus lines, in the normal mode, the plurality of amplifier means of one of said first and second amplifier groups are in their active state and the plurality of amplifier means of the other of said first and second amplifier groups are in their inactive state, and in the test mode, the plurality of amplifier means of said first and second amplifier groups are in their active state, each of said plurality of amplifier means of each of said first and second amplifier groups amplifying data appearing on said corresponding one of said plurality of data bus lines to which said each of said plurality of amplifier means is coupled; and means for comparing outputs of all of said plurality of amplifier means and for generating a digital output only when all of said plurality of amplifier means outputs are the same.

* * * * *